(12) United States Patent
Gil et al.

(10) Patent No.: US 7,304,318 B2
(45) Date of Patent: *Dec. 4, 2007

(54) SYSTEM AND METHOD FOR MASKLESS LITHOGRAPHY USING AN ARRAY OF SOURCES AND AN ARRAY OF FOCUSING ELEMENTS

(75) Inventors: Dario Gil, Cambridge, MA (US);
Rajesh Menon, Boston, MA (US);
David Carter, Cambridge, MA (US);
Henry I. Smith, Sudbury, MA (US);
George Barbastathis, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 324 days.

This patent is subject to a terminal disclaimer.

(21) Appl. No.: 11/082,629

(22) Filed: Mar. 16, 2005

(65) Prior Publication Data
US 2005/0181314 A1    Aug. 18, 2005

(51) Int. Cl.
*G21K 5/04* (2006.01)

(52) U.S. Cl. .............................. 250/492.2; 250/492.22; 378/34; 355/53; 355/67

(58) Field of Classification Search ............. 250/492.2, 250/492.22, 492.24; 378/34, 35; 355/53, 355/67; 430/5, 20, 30
See application file for complete search history.

(56) References Cited

U.S. PATENT DOCUMENTS

| 5,900,637 | A | 5/1999 | Smith |
| 6,429,443 | B1 | 8/2002 | Mankos et al. |
| 6,894,292 | B2 * | 5/2005 | Gil et al. ................. 250/492.2 |
| 2003/0122091 | A1 | 7/2003 | Almogy |

* cited by examiner

*Primary Examiner*—Kiet T. Nguyen
(74) *Attorney, Agent, or Firm*—Gauthier & Connors LLP

(57) ABSTRACT

A method is disclosed for creating a permanent pattern on a substrate. The method includes the steps of providing an array of photon sources, each of which provides a photon beam, providing an array of focusing elements, each of which focuses an associated photon beam from the array of photon sources onto a substrate, and creating a permanent pattern on a substrate using the array of focusing elements to respectively focus associated photon beams on the substrate.

20 Claims, 2 Drawing Sheets

SYSTEM AND METHOD FOR MASKLESS LITHOGRAPHY USING AN ARRAY OF SOURCES AND AN ARRAY OF FOCUSING ELEMENTS

PRIORITY

This application claims priority to U.S. application Ser. No. 10/628,809 filed Jul. 28, 2003 which claims priority to U.S. Prov. Appln. Ser. No. 60/400,812 filed Aug. 2, 2002. This invention was made with support from the United States government under Grant No. DAAD19-01-1-0330, and the United States government has certain rights to the invention.

BACKGROUND OF THE INVENTION

The invention relates to maskless lithography, and relates in particular to maskless lithography using arrays of focusing elements.

U.S. Pat. No. 5,900,637 discloses a system for maskless lithography that involves the focusing of incident energy from a single energy source onto a substrate as focused beamlets. The arrangement includes micro-mechanical devices with actuatable shutters that turn the focused beams on and off in response to commands from a control computer. To write a pattern, the substrate is scanned under the array, while the individual beams are turned on and off as needed by means of the micro-mechanical shutters, one associated with each zone plate. These shutters are disclosed to be located either between the zone plate array and the substrate, or between the zone plate array and the source of radiation. The '637 patent also discloses a lithography system that includes an array of micro-mechanical, deflectable glancing-angle mirrors that may be used to turn individual focused beams on and off.

Such lithography systems, however, require that micro-mechanical shutters or mirrors be very precise and accurately turned on and off repeatedly without significant variation. In certain applications the use of micro-mechanical shutters or mirrors may not be appropriate.

There remains a need therefore, for a maskless lithography system that does not rely on micro-mechanical devices to write using individual zone plates or other diffractive elements.

SUMMARY OF THE INVENTION

The invention provides a method for creating a permanent pattern on a substrate. The method includes the steps of providing an array of photon sources, each of which provides a photon beam, providing an array of focusing elements, each of which focuses an associated photon beam from the array of photon sources onto a substrate, and creating a permanent pattern on a substrate using the array of focusing elements to respectively focus associated photon beams on the substrate.

BRIEF DESCRIPTION OF THE DRAWINGS

The following description may be further understood with reference to the accompanying drawings in which.

The drawings are shown for illustrative purposes and are not to scale.

DETAILED DESCRIPTION OF THE ILLUSTRATED EMBODIMENTS

Figure 1:
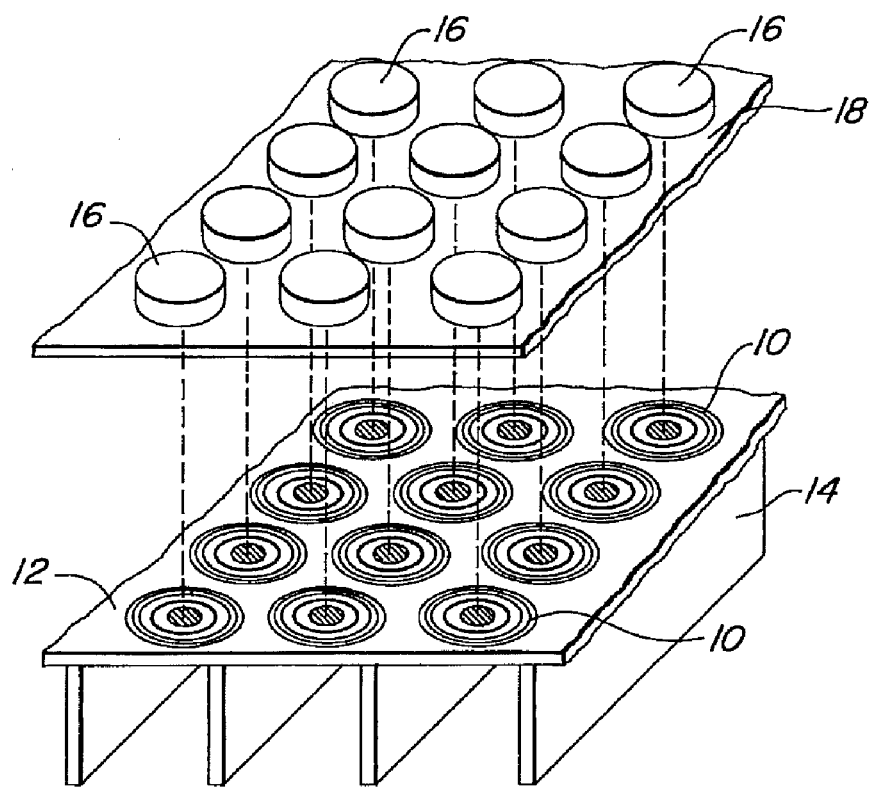
FIG. 1 shows an illustrative diagrammatic exploded view of an array of energy sources and an array of diffractive elements for use in a system in accordance with an embodiment of the invention.

The lithography systems in accordance with the invention may be used with arrays of a variety of focusing elements, such as Fresnel zone plates as disclosed in U.S. Pat. No. 5,900,637, the disclosure of which is hereby incorporated by reference. As shown in FIG. 1, an array of focusing elements 10 may be arranged on a silicon substrate 12, wherein each zone plate defines a unit cell. The array is supported on a thin membrane with vertical, anisotropically-etched silicon (Si) joists 14 for rigid mechanical support that divide rows of unit cells. Each zone plate is responsible for exposure only within its unit cell. The silicon joists are intended to provide additional rigidity to the array while minimizing obstruction. Methods of anisotropic etching of silicon are well known, and are capable of producing in silicon joists of about one or a few micrometers in thickness. In alternative embodiments of the invention, the joists may not be necessary, and the substrate need not be formed of silicon. The membrane is formed of a material that is transparent to the beam source. If the source is 4.5 nm x-ray, then the membrane may be formed of a thin carbonaceous material. If deep UV radiation is used, the membrane may be made of glass, and the zone plates may be made from phase zone plates, e.g., grooves cut into a glass plate or membrane.

An array of individually selectable sources 16 is also provided on a support substrate 18 such that each source is aligned with one of the focusing elements 10. The sources maybe semiconductor lasers, diode lasers, light emitting diodes (LEDs), vertical cavity surface emitting lasers (VCSELs) or a variety of other sources such as x-ray sources or electron beam sources. These may be microfabricated in arrays, and may provide extremely high modulation frequencies (about 1 GHz), which translates to very high patterning speeds.

The focusing elements may be any of a variety of diffractive and/or refractive elements including those disclosed in U.S. patent application Ser. No. 10/624,316 filed Jul. 22, 2003, (the disclosure of which is hereby incorporated by reference) which claims priority to U.S. Provisional Applications Ser. Nos. 60/397,705 and 60/404,514, including, for example, amplitude and/or phase Fresnel zone plates, blazed Fresnel zone plates, bessel zone plates, photon sieves (e.g., amplitude photon sieves, phase photon sieves, or alternating phase photon sieves), and the diffractive focusing elements may be apodized. These may be microfabricated in large arrays as well, and may be designed to compensate for wavefront characteristics in the radiation output from the source array to achieve, for example, the smallest possible focal spot.

Figure 2:
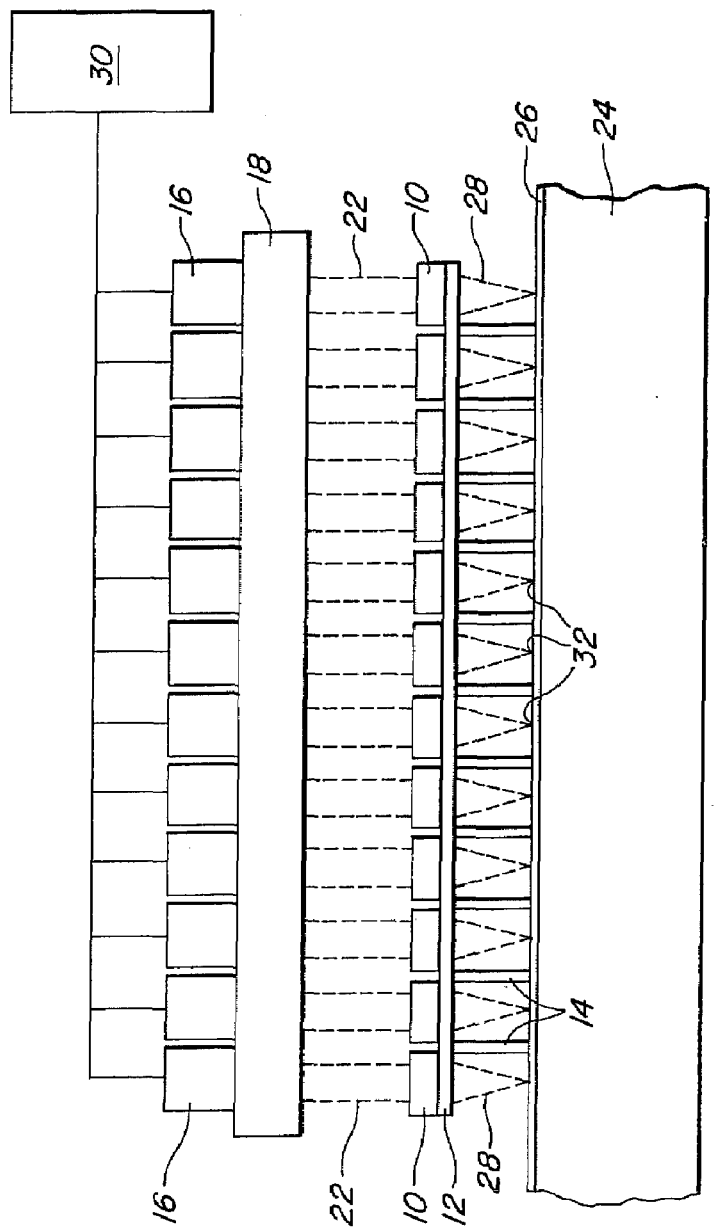
FIG. 2 shows an illustrative diagrammatic sectional view of a system in accordance with an embodiment of the invention.

FIG. 2 shows a cross-sectional schematic view of an embodiment of a maskless lithography arrangement in accordance with the invention illustrating the focusing of incident beams 22 from the array of beam sources 16 onto a substrate 24 that is coated with a resist 26 as focused beams 28. The incident beams 22 are individually turned on and off in response to commands from a control computer 30.

Shutter devices may further be interposed on either side of the array of diffractive elements 10 in certain embodiments.

Each of diffractive elements 10 on the membrane 12 is able to focus an individual beam 22 to a fine focal spot 32 on the resist-coated substrate 24, which is supported on a positioning stage. To write a pattern, the substrate is scanned under the array, while the individual beams 28 are turned on and off as needed by means of the individual energy sources 16, wherein one energy source is associated with one zone plate as shown in FIG. 1.

There are various strategies through which the scanning and writing may be achieved. For example, a serpentine writing scheme may be employed, with the substrate scanned in X and Y by a fast piezoelectric system (not shown), thereby filling in the full pattern. A square array of zone plates, with each zone plate writing only within its unit cell as discussed above is provided. The scanning in this case could be serpentine, with the positioning stage moving only a distance equal to the unit cell edge dimension in X and Y until all pixels within the unit cell are addressed, and either written (e.g., individual illumination sources are on) at a focal spot or not (i.e., individual illumination source off). The entire array would then be stepped a distance equal to the array size and scanning repeated. An alternative to a this step-and-scan strategy, is a linear-scan strategy similar to that described by M. Feldman, OSA Proceedings on Soft-X-ray Projection Lithography, Eds. A. M. Hawryluk and R. H. Stulen (Opt. Soc. Amer., Washington, D.C.) 18, 207 (1993), incorporated herein by reference. In Feldman's scheme, a close-packed array of zone plates would be azimuthally rotated relative to the scanning direction in such a way that all pixels may be addressed when the substrate is scanned along one direction only.

By selectively modulating each of an array of energy (or light) sources, while scanning a substrate, one may create arbitrary patterns. Such a system may be extremely compact (integrated) and have very high resolution and throughput.

The arrays of sources and of focusing elements may be two or three dimensional. The array of sources direct radiation onto the array of diffractive focusing elements. In certain embodiments, the array of sources may have an array of diffractive or refractive lenses to collimate the radiation, and in certain embodiments, the each of the lenses may be coupled directly to and thereby included with each of the sources 16 in FIG. 1. There would be a one to one correspondence between each light source, each lens and each diffractive focusing element. The radiation incident on each diffractive focusing element is focused into an individual spot. Because the substrate 24 that is coated with radiation-sensitive chemical 26 (such as photoresist) is placed in the focal plane of the diffractive focusing element, the pattern of spots may be transferred onto the substrate. By scanning the susbstrate therefore, one may make arbitrary patterns. The sources and focusing-lens arrays may be microfabricated on separate substrates. These substrates may be aligned and bonded together, thereby creating a very compact, maskless lithography print-head.

The invention also provides a method for performing maskless patterning using an array of light sources (which again, may be diode lasers, LEDs, VCSELs etc.) and an array of focusing lenses (which again may be diffractve or refractive or any combination thereof). The natural parallelism of such a multi-optical column writing technique when combined with the high modulation frequencies of light sources may result in a high resolution and high throughput patterning system. The proposed method consists of the following steps: a) providing an array of sources including but not limited to VCSELs, LEDs, laser diodes, sources of any wavelength, x-ray sources and even electron beam sources; b) providing an array of collimating microlenses or diffractive lenses to collimate and clean-up the source array output beam; c) providing an array of focusing lenses that may be zone plates, photon sieves, bessel zone plates, other diffractive lenses, refractive lenses, combinations of diffractive and refractive lenses, or any other elements that may be used to focus the incident radiation into an array of spots; d) individually switching the sources on and off; and e) scanning a substrate on a stage underneath the focused beams to create a pattern. Note that, the modulation of such sources may be extremely fast. Moreover, such sources may grayscale their intensity for more accurate patterning and correct for light non-uniformity across the source array. To improve the resolution of the pattern, one may even use the system in an immersion fluid.

What is claimed is:

1. A method of creating a permanent pattern on a substrate, said method comprising the steps of:
   providing an array of photon sources, each of which provides a photon beam;
   providing an array of focusing elements, each of which focuses an associated photon beam from the array of photon sources onto a substrate; and
   creating a permanent pattern on a substrate using the array of focusing elements to respectively focus associated photon beams on the substrate.

2. The method as claimed in claim 1, wherein said step of providing an array of photon sources includes the step of providing an array of light emitting diodes.

3. The method as claimed in claim 1, wherein said step of providing an array of photon sources includes the step of providing an array of semiconductor lasers.

4. The method as claimed in claim 1, wherein said step of providing an array of photon sources includes the step of providing an array of vertical cavity surface emitting lasers.

5. The method as claimed in claim 1, wherein said step of providing an array of focusing elements includes the step of providing an array of diffractive elements.

6. The method as claimed in claim 1, wherein said step of providing an array of focusing elements includes the step of providing an array of Fresnel lenses.

7. The method as claimed in claim 1, wherein said step of providing an array of focusing elements includes the step of providing an array of photon sieves.

8. The method as claimed in claim 1, wherein the step of providing an array of focusing elements includes the step of providing an array of at least one of amplitude Fresnel zone plates, phase Fresnel zone plates, blazed Fresnel zone plates, bessel zone plates, amplitude photon sieves, phase photon sieves, alternating phase photon sieves, and apodized diffractive focusing elements.

9. The method as claimed in claim 1, wherein the step of providing an array of focusing elements includes the step of providing an array of elements that are designed to compensate for wavefront characteristics in the radiation output from the array of photon sources.

10. The method as claimed in claim 1, wherein said method further includes the step of providing an array of microlenses interposed between said array of sources and said array of focusing elements.

11. The method as claimed in claim 10, wherein said array of microlenses collimate radiation from the array of photon sources.

12. The method as claimed in claim 1, wherein said step of creating a permanent pattern in a substrate includes the step of selectively switching on and off each of said photon sources.

13. A substrate including a permanent pattern formed using the method of claim 1.

14. A method of creating a permanent pattern on a substrate, said method comprising the steps of:
  providing an array of photon sources, each of which provides a photon beam;
  providing an array of focusing elements, each of which focuses an associated photon beam from the array of photon sources onto a substrate;
  providing an array of microlenses interposed between said array of sources and said array of focusing elements; and
  creating a permanent pattern on a substrate using the array of focusing elements to respectively focus associated photon beams from the array of sources via the array of microlenses on the substrate by selectively activating each of said photon sources individually.

15. The method as claimed in claim 14, wherein said step of providing an array of photon sources includes the step of providing an array of light emitting diodes.

16. The method as claimed in claim 14, wherein said step of providing an array of photon sources includes the step of providing an array of semiconductor lasers.

17. The method as claimed in claim 14, wherein said step of providing an array of photon sources includes the step of providing an array of vertical cavity surface emitting lasers.

18. The method as claimed in claim 14, wherein said step of providing an array of focusing elements includes the step of providing an array of diffractive elements.

19. The method as claimed in claim 14, wherein said step of providing an array of focusing elements includes the step of providing an array of Fresnel lenses.

20. A substrate including a permanent pattern formed using the method of claim 14.

* * * * *

UNITED STATES PATENT AND TRADEMARK OFFICE
CERTIFICATE OF CORRECTION

PATENT NO. : 7,304,318 B2
APPLICATION NO. : 11/082629
DATED : December 4, 2007
INVENTOR(S) : Gil et al.

Page 1 of 1

It is certified that error appears in the above-identified patent and that said Letters Patent is hereby corrected as shown below:

Title Page
Related U.S. Application Data should read

--(63) Continuation of application No. 10/628,809, filed on July 28, 2003, now Pat. No. 6,894,292.

(60) Provisional application No. 60/400,812, filed on August 2, 2002.--

Signed and Sealed this

Twenty Second Day of April, 2008

JON W. DUDAS
*Director of the United States Patent and Trademark Office*